(12) United States Patent
Gesklin et al.

(10) Patent No.: US 6,244,332 B1
(45) Date of Patent: Jun. 12, 2001

(54) HEAT SINK

(75) Inventors: Julio Gesklin, Glencoe; John H. Kulp, Naperville; Alan C. Krempels, Mundelein, all of IL (US)

(73) Assignee: FlexTek Components, Inc., Schiller Park, IL (US)

( * ) Notice: Subject to any disclaimer, the term of this patent is extended or adjusted under 35 U.S.C. 154(b) by 0 days.

(21) Appl. No.: 09/466,254

(22) Filed: Dec. 17, 1999

(51) Int. Cl.[7] .................................................. H05K 7/20
(52) U.S. Cl. ......................................... 165/80.3; 361/710
(58) Field of Search ................................. 165/80.3, 185; 361/704, 710

(56) References Cited

U.S. PATENT DOCUMENTS

| | | | |
|---|---|---|---|
| 3,180,404 | * | 4/1965 | Nelson et al. ........................ 165/185 |
| 5,038,858 | * | 8/1991 | Jordan et al. ........................ 165/185 |
| 5,706,169 | * | 1/1998 | Yeh ....................................... 361/690 |
| 5,771,966 | * | 6/1998 | Jacoby ................................. 165/185 |
| 5,791,406 | * | 8/1998 | Gonner et al. ....................... 165/185 |
| 6,176,304 | * | 1/2001 | Lee ...................................... 165/185 |

* cited by examiner

Primary Examiner—Allen Flanigan

(74) Attorney, Agent, or Firm—Rockey, Milnamow, Katz, Ltd.

(57) ABSTRACT

A heat sink for an electronic apparatus is disclosed, which comprises a base member and a finned member. The base member has a contact surface, which may be planar. The finned member has fins spaced from one another by webs unitary with the flanges. The finned member is secured to the base member so that each web covers an adjacent portion of the contact surface of the base member. A heat-conductive material is interposed between each web and the adjacent portion of the contact surface of the base member. In a preferred embodiment, the finned member has tabs projecting through slots in the base member and bent so as to secure the finned member mechanically to the base member. Moreover, in the preferred embodiment, the finned member has two lateral flanges and the base member has two lateral flanges, each of which is crimped around one of the lateral flanges og the finned member so as further to secure the finned member mechanically to the base member. Furthermore, in the preferred embodiment, a heat-conductive material is interposed between each web and the adjacent portion of the contact surface of the base member. In other contemplated embodiments, the finned member is secured adhesively to the base member, as by an epoxy adhesive or by a double-faced tape with an adhesive on each face. In other contemplated embodiments, the finned member is riveted, welded, as by spot welds, or brazed to the base member.

5 Claims, 2 Drawing Sheets

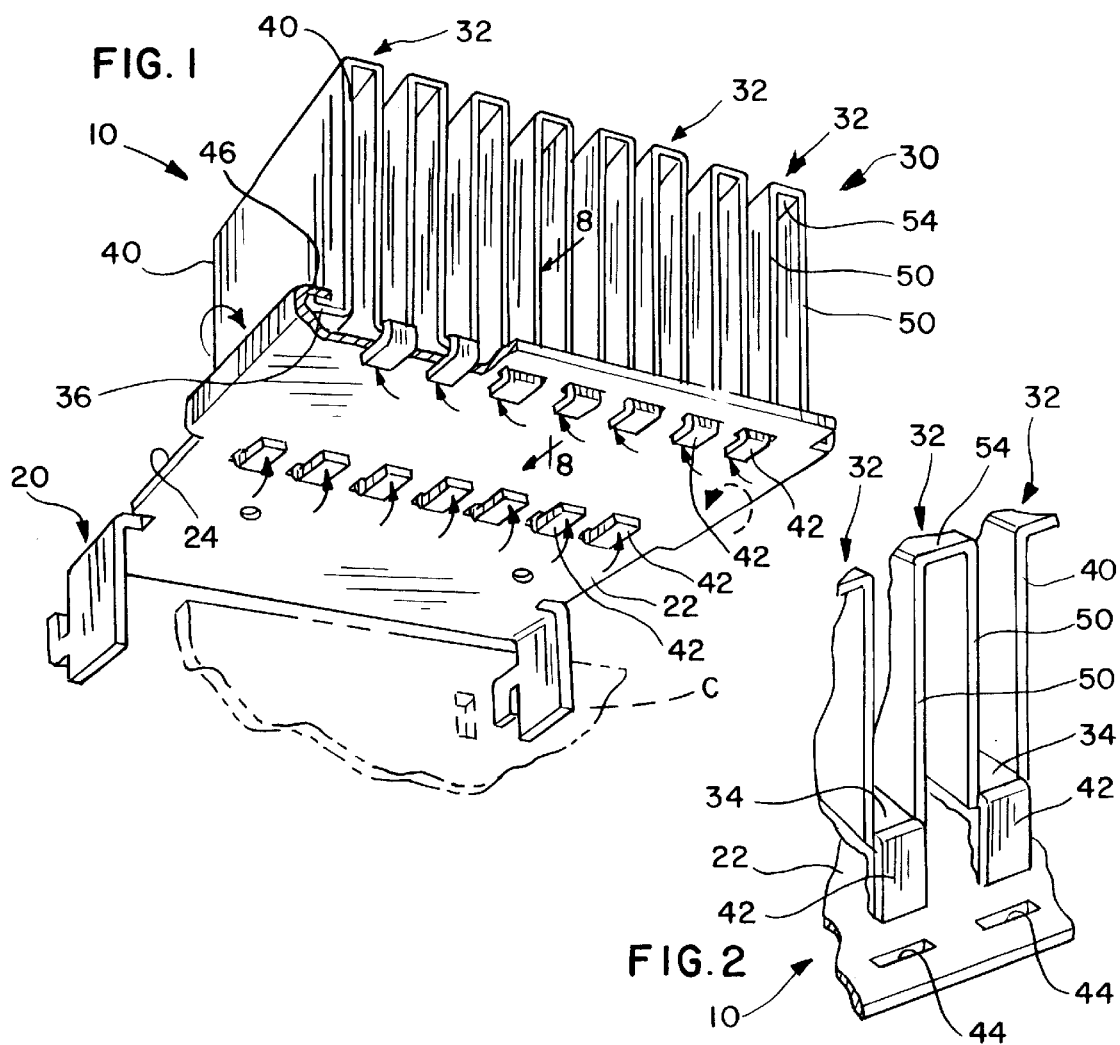
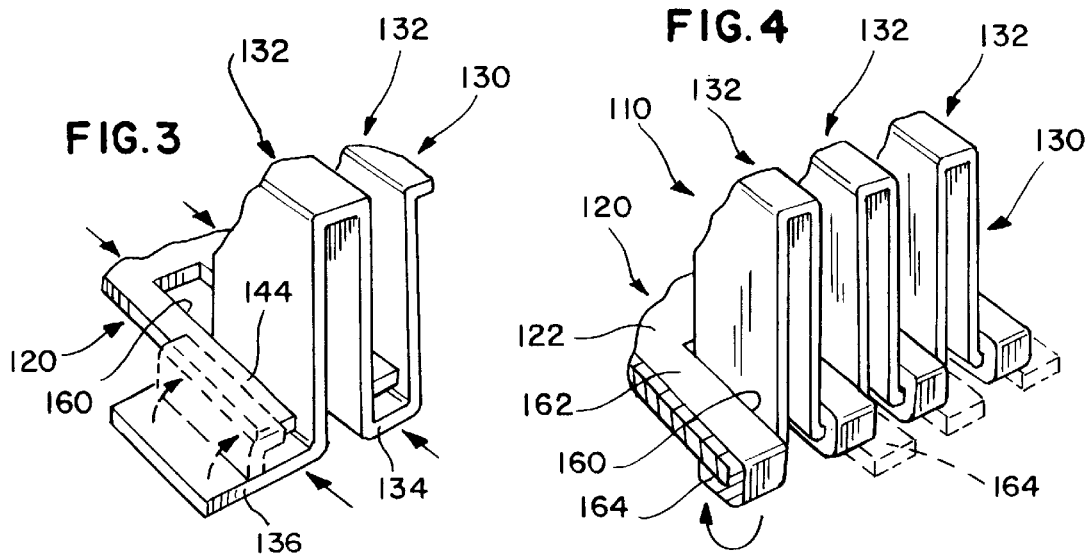

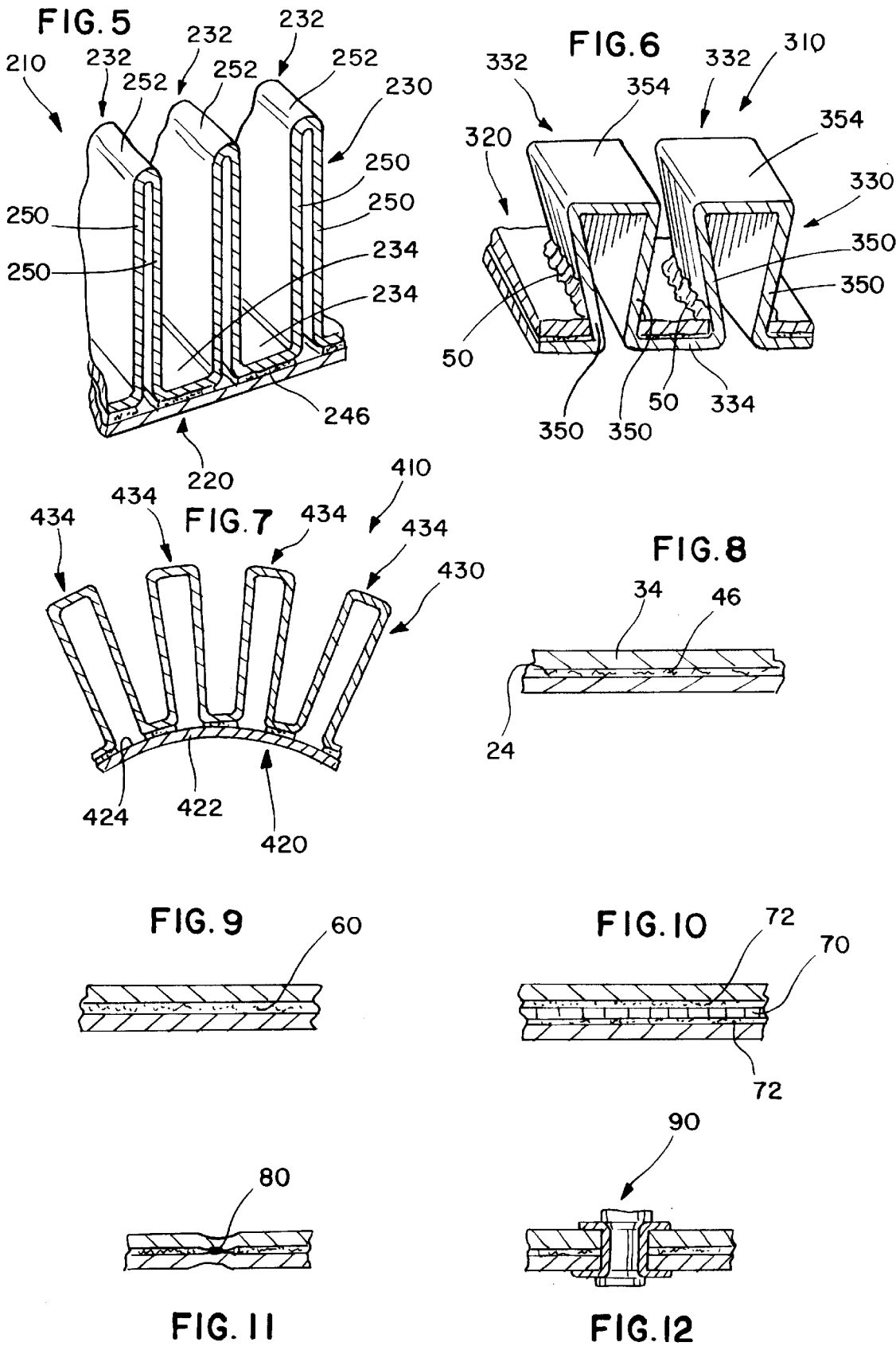

HEAT SINK

TECHNICAL FIELD OF THE INVENTION

This invention pertains to a heat sink for an electronic apparatus. The heat sink comprises a base member and a finned member. The base and finned members can be separately fabricated, e.g. by stamping, from sheet metal.

BACKGROUND OF THE INVENTION

Conventionally, a heat sink for an electronic apparatus is cast in one piece from aluminum so as to have a base and so as to have fins, which project from the base and which transfer to the ambient air, by radiation and convection, heat conducted to the fins, via the base, from heat-generating components of the electronic apparatus. Commonly, a fan is provided, which blows air along the fins so as to enhance the transfer of heat by the fins to the ambient air. Such a heat sink, which is cast in one piece, is expensive to manufacture.

SUMMARY OF THE INVENTION

This invention provides a heat sink comprising a base member and a finned member. Each of the base and finned members can be separately fabricated, e.g. by stamping, from sheet metal, such as sheet steel or sheet aluminum, sheet aluminum being preferred. As contrasted with a heat sink cast in one piece, a heat sink according to this invention is expected to be less expensive to manufacture.

The base member has a contact surface. The finned member has fins spaced from one another by webs unitary with the fins. The finned member is secured to the base member so that each web covers an adjacent portion of the contact surface of the base member. Preferably, the finned member is secured mechanically to the base member. Alternatively, the finned member is secured adhesively to the base member.

Preferably, at least when the finned member is secured mechanically to the base member, a heat-conductive material is interposed between each web and the adjacent portion of the contact surface of the base member. The heat-conductive material bridges minute gaps between the webs and the adjacent portions of the contact surface of the base member.

Preferably, when the finned member is secured mechanically to the base member, one of the members has tabs securing the finned member mechanically to the base member. More preferably, one of the members has tabs projecting through slots in the other member and bent so as to secure the finned member mechanically to the base member. Most preferably, the finned member has tabs projecting through slots in the base member and bent so as to secure the finned member mechanically to the base member.

Additionally, if the base member has two lateral flanges and if the finned member has two lateral flanges, each of the lateral portions of one said member can be then crimped around one of the lateral flanges of the other member so as further to secure the finned member mechanically to the base member.

Alternatively, so as to secure the finned member mechanically to the base member, the finned member is riveted, welded, as by spot welds, or brazed to the base member.

Alternatively, so as to secure the finned member adhesively to the base member, an adhesive, such as an epoxy, or an adhesive tape, such as a double-faced tape having an adhesive on each face, is interposed between each web and the adjacent portion of the contact surface of the base member.

These and other objects, features, and advantages of this invention can be further understood from the following description of several contemplated embodiments of this invention, with reference to the accompanying drawings.

BRIEF DESCRIPTION OF THE DRAWINGS

FIG. 1 is a partly fragmentary, lower left, perspective view of a heat sink comprising a base member and a finned member and constituting a preferred embodiment of this invention.

FIG. 2 is an exploded, fragmentary, upper left, perspective detail illustrating the base and finned members of FIG. 1, before a heat-conductive material is applied the heat sink is assembled.

FIGS. 3 and 4 are fragmentary, upper left, perspective views of a heat sink comprising a base member and a finned member and constituting an alternative embodiment of this invention, in a partly assembled state in FIG. 3 and in a further assembled state in FIG. 4.

FIG. 5 is a fragmentary, upper left, fragmentary detail of a heat sink comprising a base member and a finned member and constituting another alternative embodiment of this invention.

FIG. 6 is a fragmentary, upper left, fragmentary detail of a heat sink comprising a base member and a finned member and constituting another alternative embodiment of this invention.

FIG. 7 is a fragmentary, cross-sectional detail of a heat sink comprising a base member and a finned member and constituting another alternative embodiment of this invention.

FIG. 8, on an enlarged scale, is a fragmentary, cross-section taken along line 8—8 of FIG. 1, in a direction indicated by arrows.

FIGS. 9, 10, 11, and 12 are analogous, cross-sections illustrating alternative ways to secure the finned member to the base member.

DETAILED DESCRIPTION OF THE ILLUSTRATED EMBODIMENTS

As illustrated in FIGS. 1 and 2, a heat sink 10 for an electronic apparatus constitutes a preferred embodiment of this invention. The heat sink 10 comprises a base member 20 and a finned member 30, each having been stamped from sheet metal, such as sheet steel or sheet aluminum, sheet aluminum being preferred.

The base member 20 is mounted to a chassis C of the electronic apparatus so as to receive by conduction, via the chassis C, heat generated by heat-generating components of the electronic apparatus. The chassis C is illustrated in broken lines in FIG. 1. Details of the electronic apparatus, the chassis C, and the heat-generating components are outside the scope of this invention.

The base member 20 has a projecting panel 22 having a contact surface 24, which is planar. The finned member 30 defines plural fins 32, eight fins 32 being illustrated as an example, unitary webs 34, which space the fins 32 from one another, and two lateral flanges 36. The finned member 30 is secured to the base member 20 so that each web 34 covers an adjacent portion of the contact surface 24 and so that each flange 36 covers an adjacent portion of the contact surface 24.

The finned member 30, which has two opposite ends 40, has a tab 42 extending from each web 34, at each of the opposite ends 40. Each tab 42 projects through a slot 44 in the projecting panel 22 of the base member 20 and is bent, as illustrated, so as to secure the finned member 30 to the base member 20. The base member 20 has two lateral flanges 46, each of which is crimped around one of the lateral flanges 36 of the finned member 30 so as further to secure the finned member 30 mechanically to the base member 20.

As illustrated in FIGS. 1 and 2, in which the heat sink 10 appears in a convenient orientation that is not intended to limit its utility to any particular orientation, the tabs 42 project downwardly through the slots 44 and are bent under the projecting panel 22 of the base member 20 and the lateral flanges 46 are bent upwardly and inwardly when crimped around the lateral flanges 36 of the finned member 30.

As illustrated in FIG. 8, a heat-conductive material 46 is interposed between each web 34 and the adjacent portion of the contact surface 24 of the projecting panel 22 and between each lateral web 36 and the adjacent portion of the contact surface 24. The heat-conductive material 46 is used to bridge minute gaps between the webs 34 and the adjacent portions of the contact surface 24 and to bridge minute gaps between the flanges 36 and the adjacent portions of the contact surface 24. Preferably, Tech Spray 1978 Silicone Free Heat Sink Compound, which is available commercially from Tech Spray, Inc. of Amarallo, Tex. is employed as the heat-conductive material 46.

In an alternative embodiment, as illustrated in FIGS. 3 and 4, a heat sink 110 comprising a base member 120 and a finned member 130 is illustrated in a convenient orientation, which is not intended to limit its utility to any particular orientation. Except as illustrated and described, the base member 120 is similar to the base member 20 of the preferred embodiment and the finned member 130 is similar to the finned member 30 of the preferred embodiment. The finned member 130 has fins 132, which are similar to the fins 32 of the preferred embodiment but which project through elongate slots 160 in a projecting panel 122 of the base member 120. The finned member 130 has webs 134 similar to the webs 34 of the preferred embodiment and spacing the fins 132 from one another and two lateral flanges 136. The lateral flanges 136 are wider than the lateral flanges 36 of the preferred embodiment.

The base member 120 has a projecting panel 122 having elongate fingers 162, which are defined by the elongate slots 160 and which extend beyond the finned member 130 so as to define tabs 164. The tabs 164 are bent downwardly and under the webs 134 so as to secure the finned member 130 mechanically to the base member 120. The projecting panel 122 has two lateral flanges 144. The lateral flanges 136 of the finned member 130 are bent upwardly and over the lateral flanges 144 of the projecting panel 122 so as further to secure the finned member 130 mechanically to the base member 120. The heat sink 110 can employ a heat-conductive material similar to the heat-conductive material 46 of the preferred embodiment.

In the preferred embodiment illustrated in FIGS. 1 and 2, each fin 32 has two parallel walls 50, which are joined to each other, at their outer edges 52, by webs 54 spaced from the webs 34. Similarly, in the alternative embodiment illustrated in FIGS. 3 and 4, each fin 132 has two parallel walls 150, which are joined to each other, at their outer edges 152, by webs 154 spaced from the webs 134.

In an alternative embodiment illustrated in FIG. 5, a heat sink 210 comprises a base member 220 and a finned member 230. Except as illustrated and described, the base member 220 is similar to the base member 20 of the preferred embodiment and the finned member 230 is similar to the finned member 30 of the preferred embodiment. The finned member 230 has plural fins 232, which are spaced by webs 234, each fin 232 having two parallel walls 250 joined at a common, rounded, outer edge 252 so that the parallel walls 250 are close to each other. The heat sink 110 employs a heat-conductive material 246 similar to the heat-conductive material 46 of the preferred embodiment.

In an alternative embodiment illustrated in FIG. 6, a heat sink 310 comprises a base member 320 and a finned member 330. Except as illustrated and described, the base member 320 is similar to the base member 120 of the alternative embodiment of FIGS. 3 and 4 and the finned member 330 is similar to the finned member 130 of the alternative embodiment of FIGS. 3 and 4. The finned member 230 has plural fms 332, which are separated by webs 334. Each fin 332 has two walls 350 flaring outwardly and apart from each other and joined to each other, at their outer edges 352, by webs 354 spaced from the webs 334.

In an alternative embodiment illustrated in FIG. 7, a heat sink 410 comprising a base member 420 and a finned member 430 is similar to the heat sink 10 of the preferred embodiment, except that the base member 420 has a projecting panel 422 having a contact surface 424 that is convex and except that the finned member 430 conforms, whereby the finned member 430 has plural fins 434 that flare outwardly and apart from one another.

Alternatively, such a finned member can be mechanically secured to such a base member by brazing 50, as illustrated in FIG. 5, by an adhesive 60, such as an epoxy adhesive, as illustrated in FIG. 9, or by a double-faced tape 70 having an adhesive 72 on each face, as illustrated in FIG. 10. Alternatively, such a finned member can be mechanically secured to such a base member by spot welds, as exemplified by the spot weld 80 illustrated in FIG. 11, or by rivets, as exemplified by the rivet 90 illustrated in FIG. 12. Preferably, if brazing or welding is employed, a heat-conductive material similar to the heat-conductive material 46 of the preferred embodiment is employed.

What is claimed is:

1. For an electronic apparatus, a heat sink comprising a base member and a finned member, each said member being fabricated from sheet metal, the base member having a contact surface, the finned member having fins spaced from one another by webs unitary with the fins, the finned member being secured mechanically to the base member so that each web covers an adjacent portion of the contact surface of the base member, wherein one said member has tabs projecting through slots in the other member and bent so as to secure the finned member mechanically to the base member.

2. For an electronic apparatus, a heat sink comprising a base member and a finned member, each said member being fabricated from sheet metal, the base member having a contact surface, the finned member having fins spaced from one another by webs unitary with the fins, the finned member being secured mechanically to the base member so that each web covers an adjacent portion of the contact surface of the base member, wherein the finned member has tabs projecting through slots in the base member and bent so as to secure the finned member mechanically to the base member.

3. The heat sink of claim 1 wherein the finned member has two lateral flanges, wherein the base member has two lateral flanges, and wherein each of the lateral flanges of one said member is crimped around one of the lateral flanges of the other member so as further to secure the finned member mechanically to the base member.

4. The heat sink of claim 2 wherein the finned member has two lateral flanges, wherein the base member has two lateral flanges, and wherein each of the lateral flanges of one said member is crimped around one of the lateral flanges of the other member so as further to secure the finned member mechanically to the base member.

5. The heat sink of claim 1, 2, 3, or 4 wherein a heat-conductive material is interposed between each web and an adjacent portion of the contact surface of the base member.

\* \* \* \* \*

UNITED STATES PATENT AND TRADEMARK OFFICE
CERTIFICATE OF CORRECTION

PATENT NO. : 6,244,332 B1
DATED : June 12, 2001
INVENTOR(S) : Julio Gesklin

Page 1 of 1

It is certified that error appears in the above-identified patent and that said Letters Patent is hereby corrected as shown below:

ABSTRACT,
Line 16, "og" should read -- of --.

Column 4,
Line 17, "fms" should read -- fins --.

Signed and Sealed this

Eighteenth Day of December, 2001

Attest:

Attesting Officer

JAMES E. ROGAN
Director of the United States Patent and Trademark Office